United States Patent [19]

Kobari et al.

[11] Patent Number: 4,897,544
[45] Date of Patent: Jan. 30, 1990

[54] SIGNAL PROCESSOR OF PULSE ENCODER

[75] Inventors: Katsuo Kobari, Tachikawa; Yoshitaka Takekoshi, Hachioji; Mitsuyuki Taniguchi; Hirofumi Kikuchi, both of Hino, all of Japan

[73] Assignee: Fanuc Ltd., Yamanashi, Japan

[21] Appl. No.: 219,542

[22] PCT Filed: Oct. 22, 1987

[86] PCT No.: PCT/JP87/00807
§ 371 Date: Jun. 16, 1988
§ 102(e) Date: Jun. 16, 1988

[87] PCT Pub. No.: WO88/03259
PCT Pub. Date: May 5, 1988

[30] Foreign Application Priority Data

Oct. 23, 1986 [JP] Japan ................................. 61-250757

[51] Int. Cl.$^4$ ............................................. G01D 5/34
[52] U.S. Cl. ........................... 250/231 SE; 250/237 G
[58] Field of Search ..................... 250/231 SE, 237 G; 341/13

[56] References Cited

U.S. PATENT DOCUMENTS

| | | |
|---|---|---|
| 4,074,128 | 2/1978 | Harris, Jr. et al. ............ 250/231 SE |
| 4,266,125 | 5/1981 | Epstein et al. .................. 250/237 G |
| 4,346,447 | 8/1982 | Takahama ...................... 250/231 SE |
| 4,410,798 | 10/1983 | Breslow ........................ 250/231 SE |
| 4,680,466 | 7/1987 | Kuwahara et al. ............ 250/231 SE |
| 4,698,828 | 10/1987 | Hiramoto ...................... 250/231 SE |
| 4,700,063 | 10/1987 | Hara .............................. 250/231 SE |
| 4,767,925 | 8/1988 | Kawamoto .................... 250/231 SE |
| 4,833,316 | 5/1989 | Yoneda ......................... 250/231 SE |

Primary Examiner—David C. Nelms
Assistant Examiner—Stephone B. Allen
Attorney, Agent, or Firm—Armstrong, Nikaido, Marmelstein, Kubovcik & Murray

[57] ABSTRACT

A light receiving element (1) and an operation transistor (3) are connected in series, a plurality of signal output transistors (5a, 5b) are current-miller-connected to the operation transistors (3) in parallel, and photoelectrically converted output signals ($O_1$, $O_2$) are separately applied to a plurality of circuits in parallel from the plurality of the signal output transistors (5a, 5b). As a result, in the plurality of the circuits which receive the photoelectrically converted output signals ($O_1$, $O_2$) in parallel to carry out predetermined processes, interference will not occur, the signals are processed correctly, the power consumption is reduced, and the speed of responsitivity is improved.

3 Claims, 8 Drawing Sheets

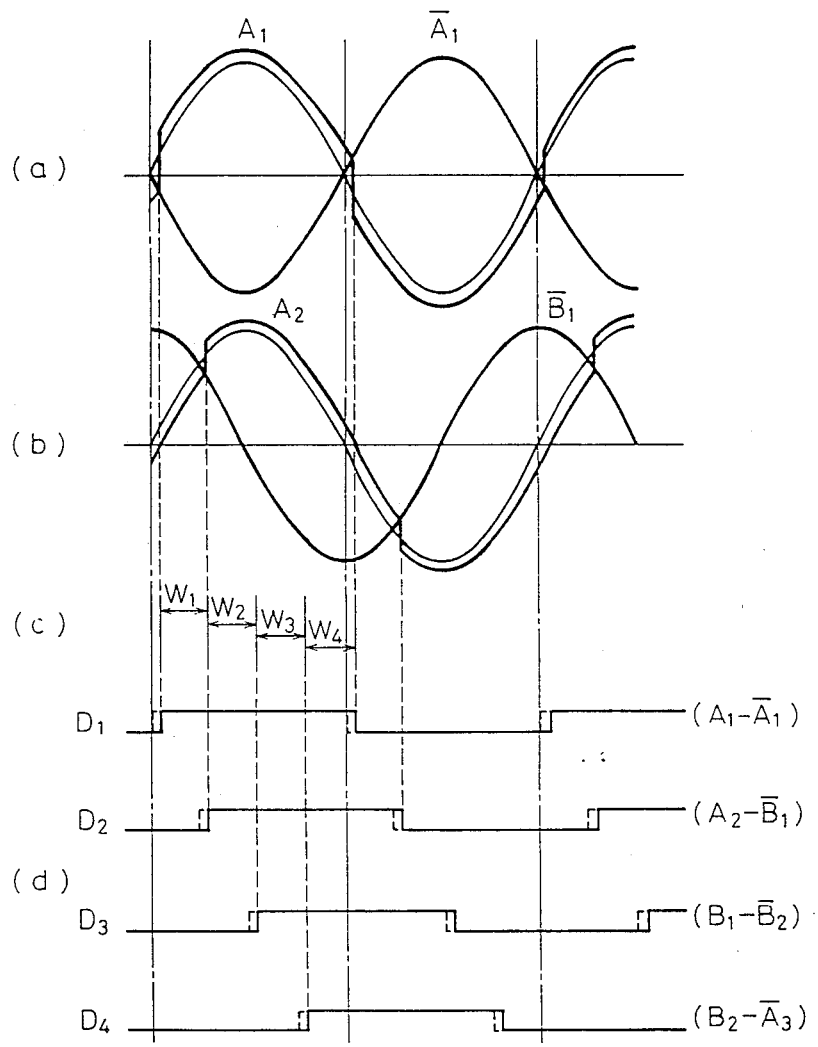

SIGNAL PROCESSOR OF PULSE ENCODER

TECHNICAL FIELD

The present invention relates to a signal processor of a pulse encoder, more particularly, to a signal processor of a pulse encoder for photoelectrically converting light made incident onto a light receiving element into output signals and supplying the photoelectrically converted output signals in parallel to a plurality of circuits to carry out predetermined processes.

BACKGROUND ART

For example, a prior signal processor of a pulse encoder comprises photodiodes and resistors, and when light is made incident onto the photodiodes, a current flows through the photodiodes in response to a strength of the light, and voltage caused by the flow of current through the photodiodes at both ends of the resistors, are picked up as the output signals.

Note, recently a technique for improving a resolution of a pulse encoder has been studied and developed by processing the photoelectrically converted output signals. In the prior art, a signal processor of the pulse encoder for improving the resolution of the pulse encoder such as the above described device has been proposed which, for example, comprises four differential amplifiers and outputs signals having a phase difference of 45 degrees from four output signals having a phase difference of 90 degrees.

However, in the signal processor of the pulse encoder according to the prior art, one photoelectrically converted output signal is directly applied to the input terminals of a plurality of differential amplifiers, and each of the differential amplifiers has a hysteresis resistor connected in parallel between the input terminal and an output terminal thereof. Consequently, the photoelectrically converted output signal applied to the input terminals of the differential amplifiers are affected by the output terminals of the differential amplifiers through hysteresis resistors, so that the four signals processed by the differential amplifiers do not have a correct phase difference of 45 degrees.

DISCLOSURE OF THE INVENTION

The object of the present invention is to perform the predetermined processes correctly without interference, to reduce the power consumption, and to improve the operation speed, in a plurality of the circuits receiving the photoelectrically converted output signals in parallel.

According to the present invention, there is provided a signal processor of a pulse encoder for photoelectrically converting light made incident onto a light receiving element into output signals, and supplying the photoelectrically converted output signals to a plurality of circuits to carry out predetermined processes, characterized in that the signal processor comprises: an operation transistor having a first input to which a first power source voltage is applied through the light receiving element, a second input to which a second power source voltage is applied and commonly connected to the first input, and a third input which is grounded; a plurality of signal output resistors, one ends thereof being supplied with a third power source voltage; and a plurality of signal output transistors of a same number as that of the signal output resistors, having first inputs connected to the other ends of the signal output resistors, second inputs connected to the second input of said operation transistor, and third inputs which are grounded, to be operated in accordance with the operation transistor, the photoelectrically converted output signals to be supplied in parallel to the plurality of circuits being separately supplied from respective connections between the signal output resistors and the first inputs of the signal output transistors.

According to the signal processor of the pulse encoder of the present invention having the above described configuration, photoelectrically converted output signals applied in parallel to the input terminals of a plurality of differential amplifiers are separately supplied from the connection portion between each signal output resistor and the first input of each signal output transistor, so that the signal processing of the signal processor can be carried out correctly by reducing a mutual interference. Furthermore, a power consumption of the signal processor of the pulse encoder according to the present invention can be reduced, and a speed of responsitivity thereof can be improved.

BEST MODE FOR CARRYING OUT THE INVENTION

First, the problems of a signal processor of a pulse encoder according to a prior art will be explained with reference to FIG. 1 to FIG. 3, before the explanation of an embodiment of a signal processor of a pulse encoder according to the present invention, and then the principle of the signal processor of the pulse encoder according to the present invention will be explained with reference to FIG. 4.

Figure 1:
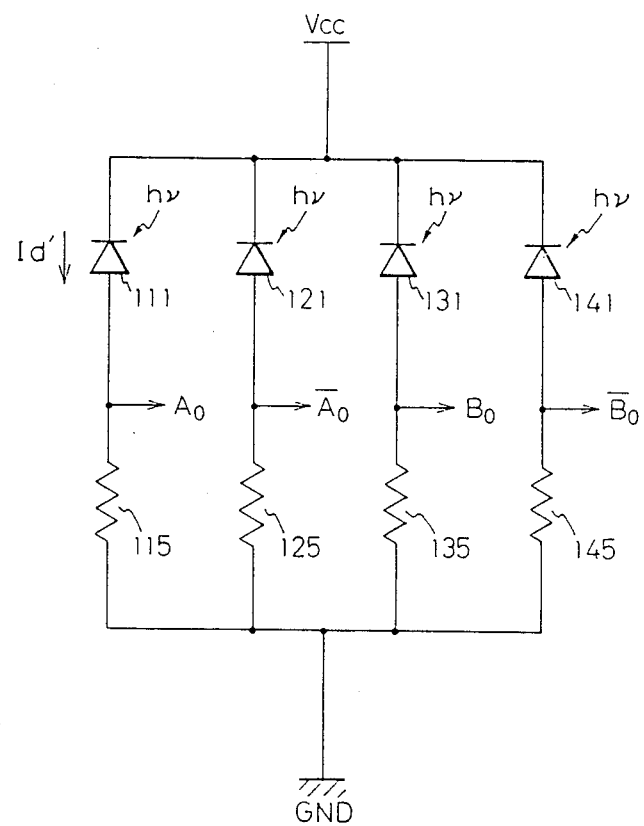
FIG. 1 is a circuit diagram showing an example of a signal processor of a pulse encoder according to a prior art.

FIG. 1 is a circuit diagram showing an example of a signal processor of a pulse encoder according to a prior art. As shown in this circuit diagram the signal processor of the pulse encoder according to the prior art comprises photodiodes 111, 121, 131, 141, and resistors 115, 125, 135, 145. A power source voltage $V_{cc}$ is applied to respective cathodes of the photodiodes 111, 121, 131, 141 and respective anodes of the photodiodes are grounded to an earth GND through the resistors 115, 125, 135, 145 respectively. From connection portions between the photodiodes 111, 121, 131, 141 and resistors 115, 125, 135, 145, output signals $A_0$, $\overline{A}_0$, $B_0$, $\overline{B}_0$ are picked up. That is, if light $h\nu$ is made incident onto the photodiode 111, a current $I_d'$ flows through the photodiode 111 in response to a strength of the light $h\nu$. A voltage caused by the current $I_d'$ at both ends of the resistor 115 is picked up as the output signal $A_0$ from the connection portion between the photodiode 111 and the resistor 115. The other output signals $\overline{A}_0$, $B_0$, $\overline{B}_0$ are picked up in the same manner. Among the four output signals $A_0$, $\overline{A}_0$, $B_0$, $\overline{B}_0$, the signal $\overline{A}_0$ is an inverted signal of the signal $A_0$, and the signal $\overline{B}_0$ is an inverted signal of the signal $B_0$. Further, a phase of the signal $A_0$ is different from that of the signal $B_0$ by 90 degrees, and thus each of the signals $A_0$, $\overline{A}_0$, $B_0$, $\overline{B}_0$ has a phase difference of 90 degrees.

Figure 2:
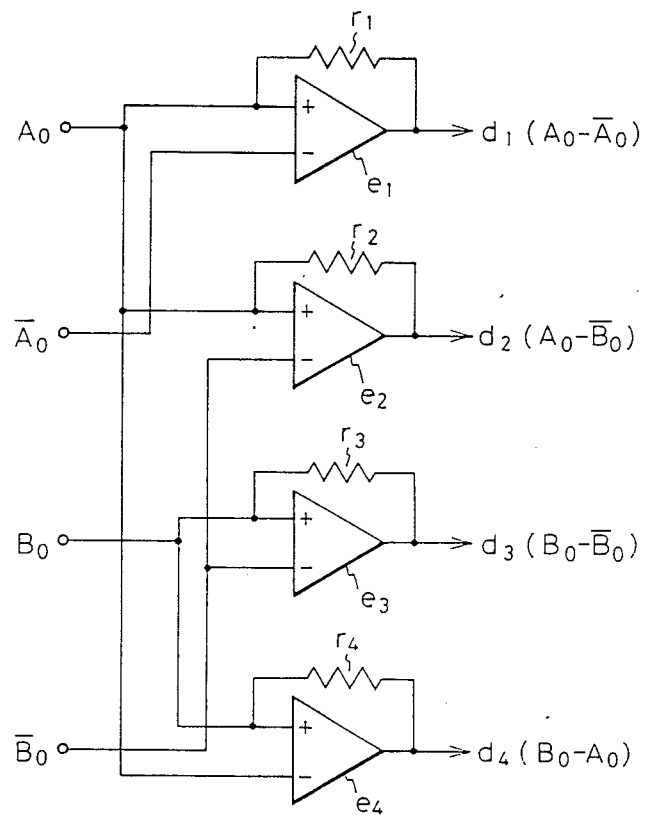
FIG. 2 is a circuit diagram showing an example of a signal processing circuit to which signals obtained by the circuit shown in FIG. 1 are supplied.

FIG. 2 is a circuit diagram showing an example of a signal processing circuit to which signals obtained by the circuit shown in FIG. 1 are supplied.

The four output signals $A_0$, $\overline{A}_0$, $B_0$, $\overline{B}_0$ described above, are applied to four differential amplifiers $e_1$, $e_2$, $e_3$, $e_4$, respectively. The four differential amplifiers $e_1$, $e_2$, $e_3$, $e_4$ carry out predetermined processes to provide four signals $d_1$, $d_2$, $d_3$, $d_4$ which will improve the resolution of the pulse encoder. Note, the signal $d_1$ is $(A_0-\overline{A}_0)$, the signal $d_2$ is $(A_0-\overline{B}_0)$, the signal $d_3$ is $(B_0-\overline{B}_0)$, and the signal $d_4$ is $(B_0-A_0)$, and thus each of the four signals $d_1$, $d_2$, $d_3$, $d_4$ theoretically has a phase difference of 45 degrees.

As described in the above, in the signal processor of the pulse encoder according to the prior art, one photoelectrically converted output signal is applied to the input terminals of a plurality of differential amplifiers. For example, the output signal $A_0$ is applied to input terminals of the differential amplifiers $e_1$, $e_2$ and to an inverted output terminal of the differential amplifiers $e_4$. Similarly, the output signal $B_0$ is applied to input terminals of the differential amplifiers $e_3$, $e_4$.

Note, hysteresis resistors $r_1$, $r_2$, $r_3$, $r_4$ are connected in parallel between the input terminals and the output terminals of the differential amplifiers $e_1$, $e_2$, $e_3$, $e_4$ respectively. These hysteresis resistors $r_1$, $r_2$, $r_3$, $r_4$ prevent oscillation of the differential amplifiers, even if the same level signals are applied to the respective differential amplifiers. Therefore, the affects of the output terminals of the differential amplifiers $e_1$, $e_2$ are added to the signal $A_0$ through the hysteresis resistors $r_1$, $r_2$, and affects of the output terminals of the differential amplifiers $e_3$, $e_4$ are added to the signal $B_0$ through the hysteresis resistors $r_3$, $r_4$. The output signal $\overline{A}_0$ is applied to the inverted input terminal of the differential amplifier $e_1$, and the output signal $\overline{B}_0$ is applied to the inverted input terminal of the differential amplifiers $e_3$, $e_4$.

Figure 3:
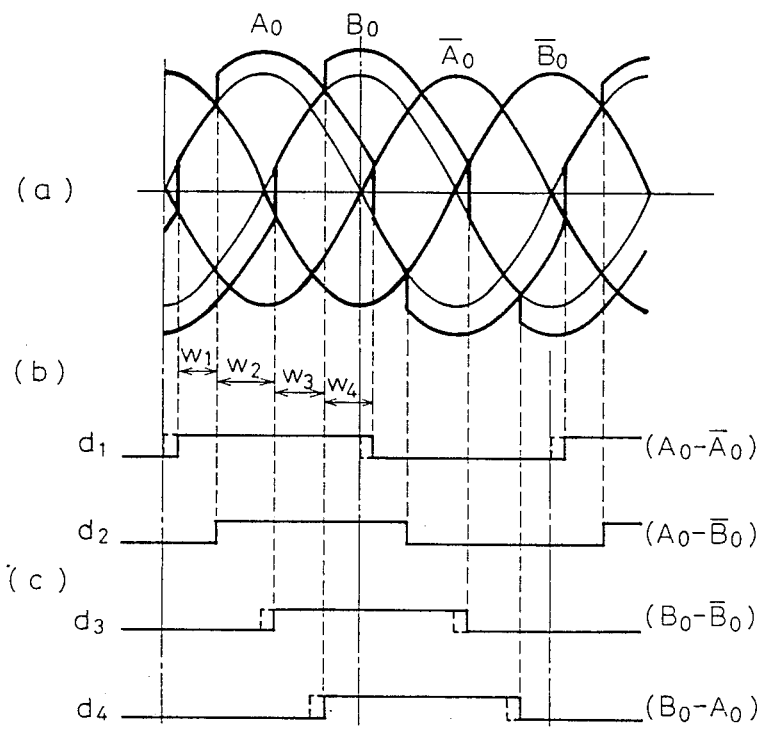
FIG. 3 is a waveform diagram showing signals to be processed by the circuit shown in FIG. 2.

FIG. 3 is a view explaining the problems of the prior art, and showing a waveform of signals processed by the circuit shown in FIG. 2. As apparent from FIG. 3(a) and 3(b), due to the affects (deformation of the waveforms of the output signals $A_0$ and $B_0$) of the hysteresis resistors $r_1$, $r_2$, $r_3$, $r_4$ provided from the differential amplifiers $e_1$, $e_2$, $e_3$, $e_4$ respectively, each of the waveforms of the four signals $d_1$, $d_2$, $d_3$, $d_4$ processed by the differential amplifiers $e_1$, $e_2$, $e_3$, $e_4$ shown in FIG. 2 does not have a correct phase difference of 45 degrees. That is, although the four signals $d_1$, $d_2$, $d_3$, $d_4$ accurately divide an interval in which the signal $A_0$ changes from 0 to 180 degrees into four segments (45-degree intervals), the signals provide four processed signals with intervals $w_1$, $w_2$, $w_3$, $w_4$ which are not equal to each other, in that the interval $w_1$ is short and the interval $w_2$ is long, as shown in FIG. 3(b). Therefore, it is impossible to improve the resolution of the pulse encoder.

The present invention intends to solve the problems of the signal processor of the pulse encoder according to the prior art.

Next, the principle of a signal processor of a pulse encoder according to the present invention will be described.

Figure 4:
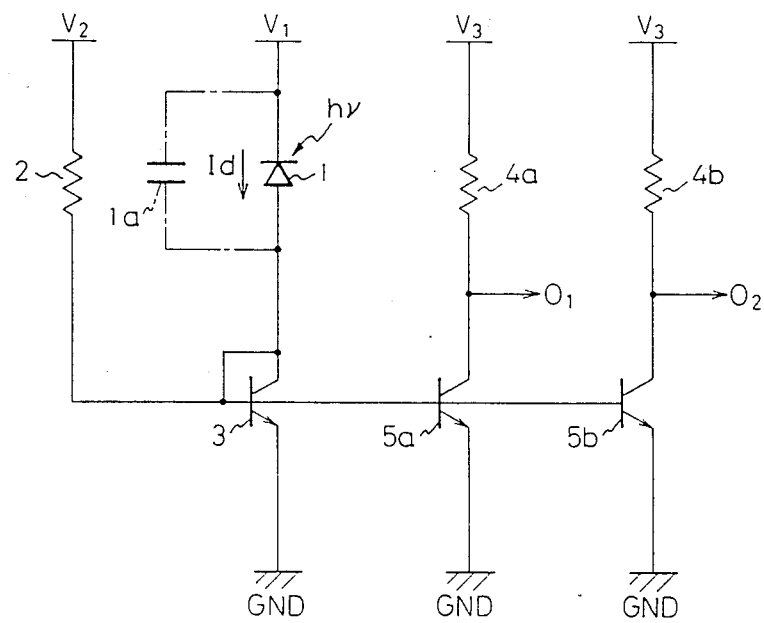
FIG. 4 is a circuit diagram showing the principle of a signal processor of a pulse encoder according to the present invention.

FIG. 4 is a circuit diagram showing the principle of a signal processor of a pulse encoder according to the present invention. As shown in FIG. 4, the signal processor of the pulse encoder according to the present invention photoelectrically converts light made incident onto a light receiving element 1 into output signals $O_1$, $O_2$, and applies the photoelectrically converted output signals to a plurality of circuits to carry out predetermined processes. This signal processor of the pulse encoder according to the present invention comprises; an operation transistor 3 having a first input to which a first power source voltage $V_1$ is applied through the light receiving element 1, a second input to which a second power source voltage $V_2$ is applied and commonly connected to the first input, and a third input which is grounded; a plurality of signal output resistors 4a, 4b, one ends thereof being supplied with a third power source voltage $V_3$; and a plurality of signal output transistors 5a, 5b of the same number as that of the signal output resistors, having first inputs connected to the other ends of the signal output resistors 4a, 4b, second inputs connected to the second input of the operation transistor 3, and third inputs which are grounded, to be operated in accordance with the operation transistor 3.

The photoelectrically converted output signals $O_1$, $O_2$ to be supplied in parallel to the plurality of circuits are separately supplied from respective connections between the signal output resistors 4a, 4b and the first inputs of the signal output transistors 5a, 5b.

According to the signal processor of the pulse encoder of the present invention with the above described configuration, one end of the light receiving element 1 is supplied with the power source voltage $V_1$, and another end of the light receiving element is connected to the first input of the operation transistor 3. The second input of the operation transistor is connected to one end of the voltage holding resistor 2, the another of which end receives the power source $V_2$ and is commonly connected to the light input of the operation transistor 3. The third input of the operation transistor is grounded to the earth GND.

The signal output transistors 5a, 5b are provided in the same number as that of the plurality of the signal output resistors 4a 4b, one ends of which receive the power source voltage $V_3$. The first inputs of the signal output transistors are connected to the signal output resistors 4a, 4b, the second inputs thereof are commonly connected to the second input of the operation transistor 3, and the third inputs thereof are grounded to the earth GND.

When light is not made incident onto the light receiving element 1, the power source voltage $V_2$ is applied to the second inputs of the operation transistor 3 and the signal output transistors 5a, 5b through the voltage holding resistor 2, so that a weak current of, for example, 2 to 3 $\mu$A, flows through the respective transistors. Due to the flow of the current to the operation transistor 3 and signal output transistors 5a, 5b, the second inputs of the respective transistors maintain a potential of, for example, about 0.6 volts, even if light is not made incident onto the light receiving element 1. In this way, by maintaining the potential of the second inputs of the respective transistors at, for example, about 0.6 volts, when light is not made incident onto the light receiving element 1, a current of, for example 40 µA, will flow when light hν is made incident onto the light receiving element 1. At this time, the voltage holding resistor 2 increases the potential of the second inputs of the respective transistors from 0.6 volts to 0.61 volts, instead of increasing from 0 volts to 0.61 volts, thus reducing a time delay required for increasing the potential of the second inputs of the above-mentioned transistors.

When the light hν is made incident onto the light receiving element 1, a current $I_d$ flows through the light receiving element 1. At this time, the current $I_d$ (for example, about 40 µA) flowing through the light receiving element 1 through the operation transistor 3 substantially not affected by a junction capacitance 1a of the light receiving element 1 and a wiring capacitance of the light receiving element 1, because an internal resistance of the operation transistor 3 is small. In this way, if a current of, for example, 40 µA, flows through the operation transistor 3, a current of 40 µA, which is the same value as that flowing through the operation transistor 3, flows through the signal output transistors 5a, 5b, the second inputs of which are commonly connected (current-miller connected) to the second input of the operation transistor 3. Therefore, at connections between the first inputs of the respective signal output transistors 5a, 5b and the corresponding signal output resistors 4a, 4b, the output signals $O_1$, $O_2$ are transmitted each having a voltage which is lower than the power source voltage $V_3$ by a voltage between both ends of each of the signal output resistors. Note, the transistors used as both the operation transistor 3 and the signal output transistors 5a, 5b have a small junction capacitance and are a high-speed type.

As described above, a plurality of the output signals $O_1$, $O_2$ are obtained in response to the light hν which is made incident onto the light receiving element 1. The output signals $O_1$, $O_2$ are separately applied to a plurality of circuits in parallel, so that, in the plurality of the circuits for performing predetermined processes, signals can be correctly processed without interference between the circuits.

Next, with reference to the drawings, an embodiment of a signal processor of a pulse encoder according to the present invention will be described.

Figure 5:
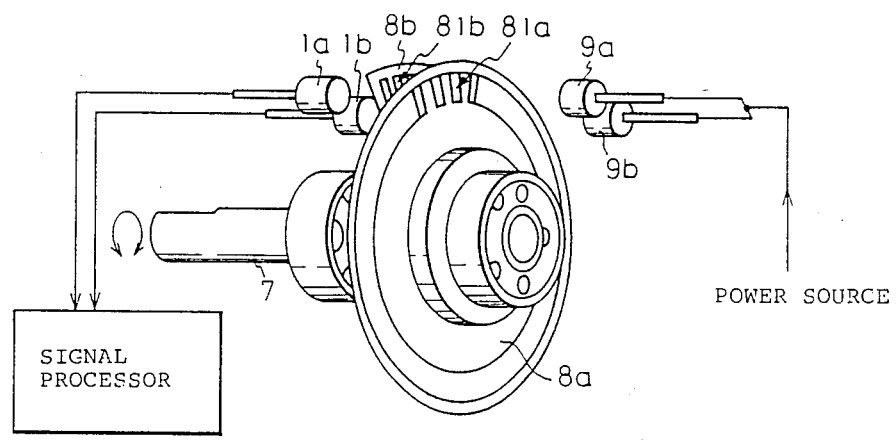
FIG. 5 is a schematic view showing an example of a pulse encoder adopting the signal processor of the pulse encoder according to the present invention.
Figure 6A:
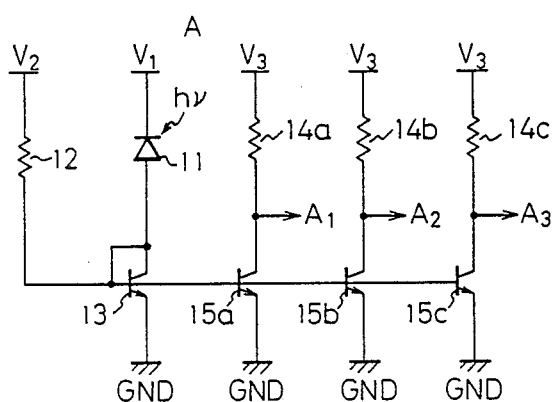
FIG. 6 is a circuit diagram showing an embodiment of the signal processor of the pulse encoder according to the present invention.
Figure 6B:
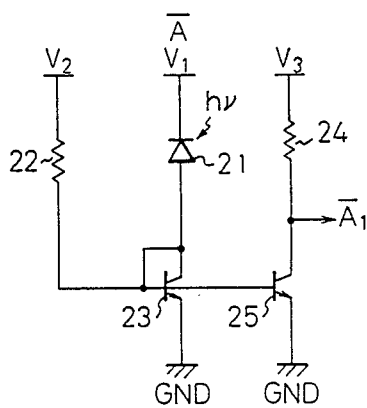
Figure 6C:
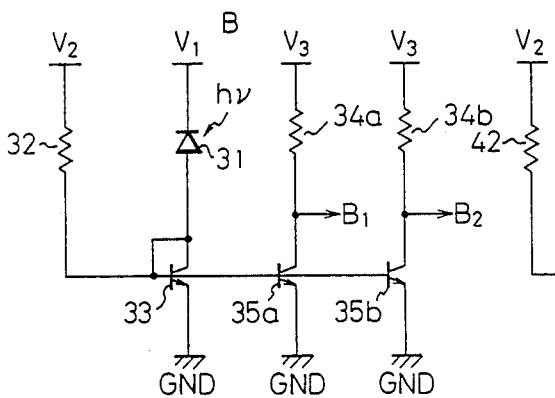
Figure 6D:
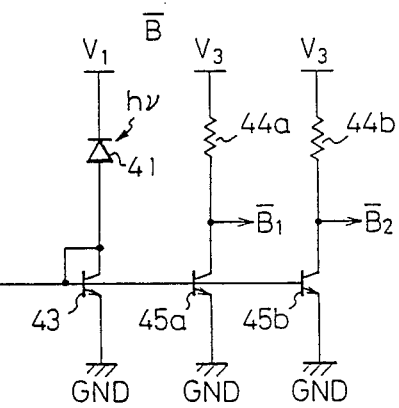

FIG. 5 is a schematic view showing an example of a pulse encoder adopting the signal processor of the pulse encoder according to the present invention. As shown in the drawing, the signal processor of the pulse encoder of the present invention is used, for example, for counting the number of revolutions of a motor. A rotary disk 8a having a plurality of slits 81a is fitted to a rotary shaft 7 of the motor, and a fixed disk 8b is provided with a plurality of slits 81b. Light from light emitting diodes 9a, 9b is intermittently made incident, due to the positional relationships of the disks 8a and 8b, detected by photodiodes 1a, 1b, and subjected to a predetermined process in the signal processor to obtain, for example, signals having an improved resolution. In FIG. 5, two photodiodes are arranged, and these two photodiodes 1a, 1b are arranged such that light from the light emitting diodes 9a, 9b is made incident with a phase difference of, for example, 90 degrees, through the plurality of slits of the rotary disk 8a and of the fixed disk 8b, to obtain output signals A and B.

The plurality of slits 81a and 81b formed on the rotary disk 8a and the fixed disk 8b, respectively, have manufacturing limits (for example, 2 µm). To improve the manufacturing limits of the slits, four signals A, $\overline{A}$, B, $\overline{B}$ having phases which differ from each other by 90 degrees are picked out and subjected to predetermined processes to obtain signals (each having a phase difference of 45 degrees) for doubling an accuracy of the pulse encoder. Note, the signal $\overline{A}$ is an inverted signal of the signal A and has a phase difference of 180 degrees with respect to the signal A, and the signal $\overline{B}$ is an inverted signal of the signal B and has a phase difference of 180 degrees with respect to the signal B.

FIG. 6 is a circuit diagram showing an embodiment of the signal processor of the pulse encoder according to the present invention, and FIG. 7 is a circuit diagram showing an example of a signal processing circuit to which signals obtained by the circuit shown in FIG. 6 are supplied. The circuits shown in FIGS. 6(a) to 6(d) are constituted in the same manner as that of the circuit shown in FIG. 4, but have a different number of signal output resistors and signal output transistors depending on the number of output signals.

As shown in FIGS. 6 and 7, in an example of the signal processor of the pulse encoder according to the present invention, four output signals A, $\overline{A}$, B, $\overline{B}$ each having a phase which is different from another by 90 degrees are supplied as input signals to differential amplifiers $E_1$, $E_2$, $E_3$, $E_4$. The number of the output signal A, $\overline{A}$, B, $\overline{B}$ is determined in accordance with the number of signals to be applied to the four differential amplifiers, and the number of signal output resistors and the number of signal output transistors are determined in accordance with the number of signals to be applied to the differential amplifiers.

Figure 7A:
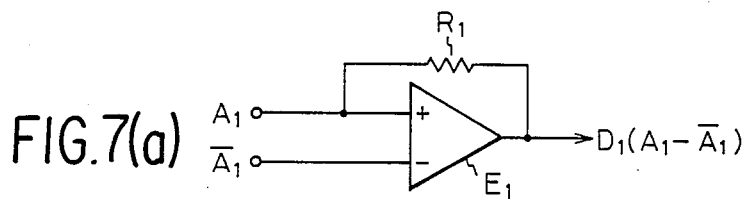
FIG. 7 is a circuit diagram showing an example of signal processing circuit to which signals obtained by the circuit shown in FIG. 6 are supplied; and, FIG. 8 is a waveform diagram showing signals to be processed by the circuit shown in FIG. 7.
Figure 7B:
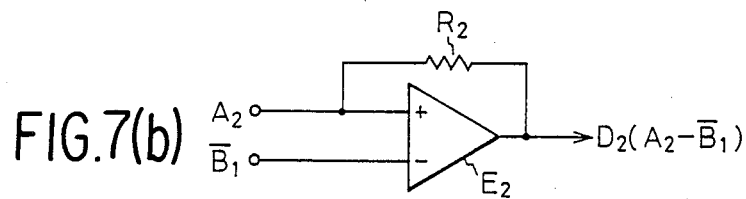
Figure 7C:
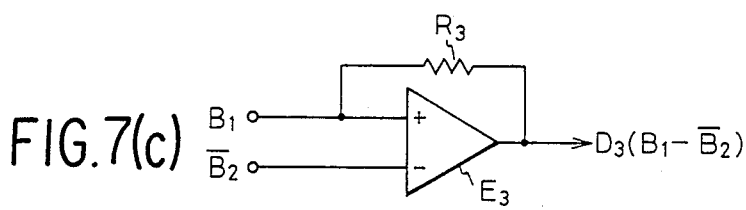
Figure 7D:
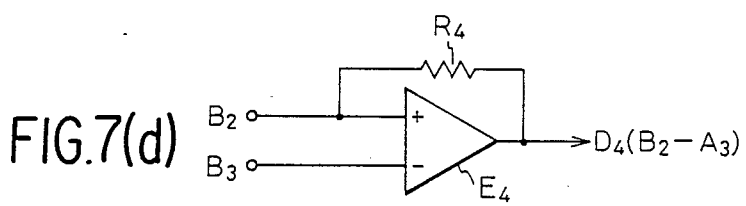

That is, as shown in FIG. 7(a), the signal A is applied to three input terminals, i.e., input terminals of the differential amplifiers $E_1$, $E_2$ and an inverted input terminal of the differential amplifier $E_4$. Therefore, the signal A is constituted such that three output signals $A_1$, $A_2$, $A_3$ are obtained by three signal output transistors 15a, 15b, 15c. The signal $\overline{A}$ is applied only to an inverted input terminal of the differential amplifier $E_1$ and constituted such that one output signal $\overline{A}$ is obtained by one signal output resistor 24 and one signal output transistor 25. The signal B is applied to two input terminals of the differential amplifiers $E_3$, $E_4$, and the signal $\overline{B}$ is applied to two inverted input terminals of the differential amplifiers $E_2$, $E_3$, and therefore, are constituted to obtain two output signals $B_1$, $B_2$ and $\overline{B}_1$, $\overline{B}_2$ respectively, by two respective output resistors 34a, 34b and 44a, 44b, and two respective output transistors 35a, 35b and 45a, 45b.

The above described output signals $A_1$, $A_2$, $A_3$; $B_1$, $B_2$; and $\overline{B}_1$, $\overline{B}_2$ are applied as input signals to the four differential amplifiers $E_1$, $E_2$, $E_3$, $E_4$ to obtain four signals $D_1$, $D_2$, $D_3$, $D_4$ after predetermined processes. Note, the signal $D_1$ is $(A_1-\overline{A}_1)$, the signal $D_2$ is $(A_2-\overline{B}_1)$, the signal $D_3$ is $(B_1-\overline{B}_2)$ and the signal $D_4$ is $(B_2-A_3)$.

FIG. 8 is a waveform diagram showing signals to be processed by the circuit shown in FIG. 7. FIG. 8(a) shows waveforms of the signals $A_1$ and $\overline{A}_1$ in the differential amplifier $E_1$. Since the signal $A_1$ is applied to an input terminal of the differential amplifier $E_1$, the waveform thereof is slightly deformed by a hysteresis resistor $R_1$ connected to the input and output terminals in parallel. Similarly, FIG. 8(b) shows waveforms of the signal $A_2$ and $\overline{B}_1$ in the differential amplifier $E_2$. Since the signal $A_2$ is applied to the input terminal of the differential amplifier $E_2$, the waveform thereof is slightly deformed by a hysteresis resistor $R_2$ connected to the input and output terminals in parallel. However, the deformations of the signals are applied to the input terminals of the differential amplifiers $E_3$, $E_4$, so that the four processed signals $D_1$, $D_2$, $D_3$, $D_4$ will correctly divide an interval, in which the signal A ($A_1$, $A_2$, $A_3$) changes from 0 to 180 degrees, into four segments (45-degree intervals). That is, each of the intervals $W_1$, $W_2$, $W_3$, $W_4$ of the four processed signals will have an even length. The four signal $D_1$, $D_2$, $D_3$, $D_4$ each having an accurate phase interval of 45 degrees can improve the resolution of the pulse encoder.

In the above described embodiment, the four signals A, $\overline{A}$, B, $\overline{B}$ have been used as output signals, and the differential amplifiers $E_1$, $E_2$, $E_3$, $E_4$ have been used as circuits for processing four signals. However, the signal processor of the pulse encoder according to the present invention is not limited to a processing of four output signals by four differential amplifiers. Although photodiodes have been used as the light receiving elements, the signal processor of the pulse encoder according to the present invention can also used phototransistors, etc., instead of the photodiodes, as light receiving elements.

We claim:

1. A signal processor of a pulse encoder for photoelectrically converting light (hν) made incident onto a light receiving element (1) into output signals ($O_1$, $O_2$) and supplying said photoelectrically converted output signals to a plurality of circuits to carry out predetermined processes, characterized in that said signal processor comprises:

an operation transistor (3) having a first input to which a first power source voltage ($V_1$) is applied through said light receiving element (1), a second input to which a second power source voltage ($V_2$) is applied and commonly connected to said first input, and a third input which is grounded;

a plurality of signal output resistors (4a, 4b), one ends thereof being supplied with a third power source voltage ($V_3$); and a plurality of signal output transistors (5a, 5b) of a same number as that of said signal output resistors, having first inputs connected to the other ends of said signal output resistors (4a, 4b), second inputs connected to said second input of said operation transistor (3), and third inputs which are grounded, to be operated in accordance with said operation transistor (3), said photoelectrically converted output signals ($O_1$, $O_2$) to be supplied in parallel to said plurality of circuits being separately supplied from respective connections between said signal output resistors (4a, 4b) and said first inputs of said signal output transistors (5a, 5b).

2. A signal processor according to claim 1, wherein said second input of said operation transistor (3) is supplied with said second power source voltage ($V_2$) through a voltage holding resistor (2).

3. A signal processor according to claim 1, wherein said plurality of circuits being supplied with said photoelectrically converted output signals ($O_1$, $O_2$) comprise differential amplifiers having hysteresis resistors.

* * * * *